(12) United States Patent
Tsushima et al.

(10) Patent No.: US 8,576,608 B2
(45) Date of Patent: Nov. 5, 2013

(54) MEMORY APPARATUS

(75) Inventors: Tomohito Tsushima, Tokyo (JP);
Makoto Kitagawa, Kanagawa (JP);
Tsunenori Shiimoto, Kanagawa (JP);
Chieko Nakashima, Nagasaki (JP);
Hiroshi Yoshihara, Nagasaki (JP);
Kentaro Ogata, Nagasaki (JP)

(73) Assignee: Sony Corporation, Tokyo (JP)

( * ) Notice: Subject to any disclaimer, the term of this patent is extended or adjusted under 35 U.S.C. 154(b) by 10 days.

(21) Appl. No.: 13/310,839

(22) Filed: Dec. 5, 2011

(65) Prior Publication Data
US 2012/0212994 A1     Aug. 23, 2012

(30) Foreign Application Priority Data

Dec. 13, 2010   (JP) ................................. 2010-276748

(51) Int. Cl.
*G11C 11/00*     (2006.01)
*G11C 13/00*     (2006.01)

(52) U.S. Cl.
CPC .................................. *G11C 13/0069* (2013.01)
USPC .................... 365/148; 365/100; 365/189.011; 365/189.07; 365/210.1; 365/189.04

(58) Field of Classification Search
CPC .............. G11C 2211/4016; G11C 2211/5643; G11C 2213/31; G11C 2213/32
USPC .......... 365/148, 100, 189.011, 189.07, 210.1, 365/189.04
See application file for complete search history.

(56) References Cited

U.S. PATENT DOCUMENTS

2009/0225586 A1*   9/2009   Ueda .............................. 365/158

FOREIGN PATENT DOCUMENTS

| JP | 2006-196537 | 7/2006 |
| JP | 2009-043757 | 2/2009 |

\* cited by examiner

*Primary Examiner* — Thong Q Le
(74) *Attorney, Agent, or Firm* — Dentons US LLP (57) ABSTRACT

A memory apparatus includes: a plurality of memory cells which includes a first resistance change element; and a read-out circuit which determines the size of a resistance value of the first resistance change element by comparing the resistance state of a memory cell selected among the plurality of memory cells to the resistance state of a reference memory cell, wherein the reference memory cell includes a second resistance change element, a resistance value of the second resistance change element with respect to an applied voltage is smaller than that in a high resistance state of the first resistance change element, and the second resistance change element shows the same resistance change characteristic as the first resistance change element.

8 Claims, 7 Drawing Sheets

MEMORY APPARATUS

FIELD

The present disclosure relates to a memory apparatus having a resistance change-type storage element (resistance change element), and more particularly, to a memory apparatus provided with a read-out circuit which determines a storage state (size of a resistance value) by a reference memory cell.

BACKGROUND

As nonvolatile storage elements in which no information is erased even when power is turned off, there have been proposed, for example, flash memories, Ferroelectric Random Access Memories (FeRAMs), Magnetoresistive Random Access Memories (MRAMs) and the like. In these storage elements, the written information can be continuously held for a long period of time even when power is not supplied. However, these storage elements have a problem. For example, flash memories have a high integration level, but have a low working speed. FeRAMs have a problem in the manufacturing process, and MRAMs have a problem in terms of their power consumption.

Accordingly, memory apparatuses having a new type of resistance change-type storage element have been developed. This storage element has a structure in which an ionic conductor containing a predetermined metal is disposed between two electrodes (for example, JP-A-2006-196537 and JP-A-2009-43757). In this storage element, atoms or ions are moved by heat or an electric field, and it is thought that the resistance value changes due to the formation of a conduction path.

In the data read-out from a memory cell having a plurality of the nonvolatile storage elements, a read-out circuit may be used to determine a state of the storage element, that is, determine whether the state is a written state or an erased state.

SUMMARY

In memory apparatuses having, for example, a resistance-type storage element, a reference memory cell having an intermediate resistance value between a resistance value in a written state and a resistance value in an erased state may be used in a read-out circuit.

However, depending on the configuration of the storage element and the manufacturing method, it is not easy to manufacture such a reference memory cell. Particularly, in the case of storage elements of the same type as in JP-A-2006-196537 and JP-A-2009-43757, the resistance value of the storage element nonlinearly changes in accordance with the level of a read-out voltage, and thus it is very difficult to prepare a reference memory cell corresponding to all of read-out voltages.

Thus, it is desirable to provide a memory apparatus which can accurately determine a state of a storage element regardless of the level of a read-out voltage.

A memory apparatus according to an embodiment of the present disclosure includes a plurality of memory cells which includes a first resistance change element and a read-out circuit which determines the size of a resistance value of the first resistance change element by comparing the resistance state of a memory cell selected among the plurality of memory cells to the resistance state of a reference memory cell. The reference memory cell includes a second resistance change element, a resistance value of the second resistance change element with respect to an applied voltage is smaller than that in a high resistance state of the first resistance change element, and the second resistance change element shows the same resistance change characteristic as the first resistance change element.

In the memory apparatus according to the embodiment of the present disclosure, the resistance state of a selected memory cell is compared to the resistance state of the reference memory cell in the read-out operation, and with the result thereof, the size of a resistance value of the first resistance change element of the memory cell (that is, whether the state is a written state or an erased state) is determined. Here, the resistance value of the memory cell nonlinearly changes in accordance with the level of the read-out voltage. However, the resistance value of the reference memory cell (second resistance change element) changes to correspond to the change in the resistance value of the memory cell, and the determination is accurately carried out in accordance with the read-out voltage.

In the memory apparatus according to the embodiment of the present disclosure, since the reference memory cell is constituted of the second resistance change element showing the same resistance change characteristic as the first resistance change element which is included in the memory cell, it is possible to accurately determine the size of a resistance value of the memory cell, that is, determine whether the state is a written state or an erased state regardless of the level of a read-out voltage.

DETAILED DESCRIPTION

Hereinafter, embodiments of the present disclosure will be described in detail with reference to the drawings. The description will be given in the following order.

1. First Embodiment (an example in which a second resistance change element constituting a reference memory cell has an area larger than that of a first resistance change element of a memory cell)

2. Second Embodiment (an example in which a second resistance change element constituting a reference memory cell is provided with a plurality of resistance change elements having the same configuration as that of a first resistance change element)

First Embodiment

Configuration of Memory Apparatus 1

Figure 1:
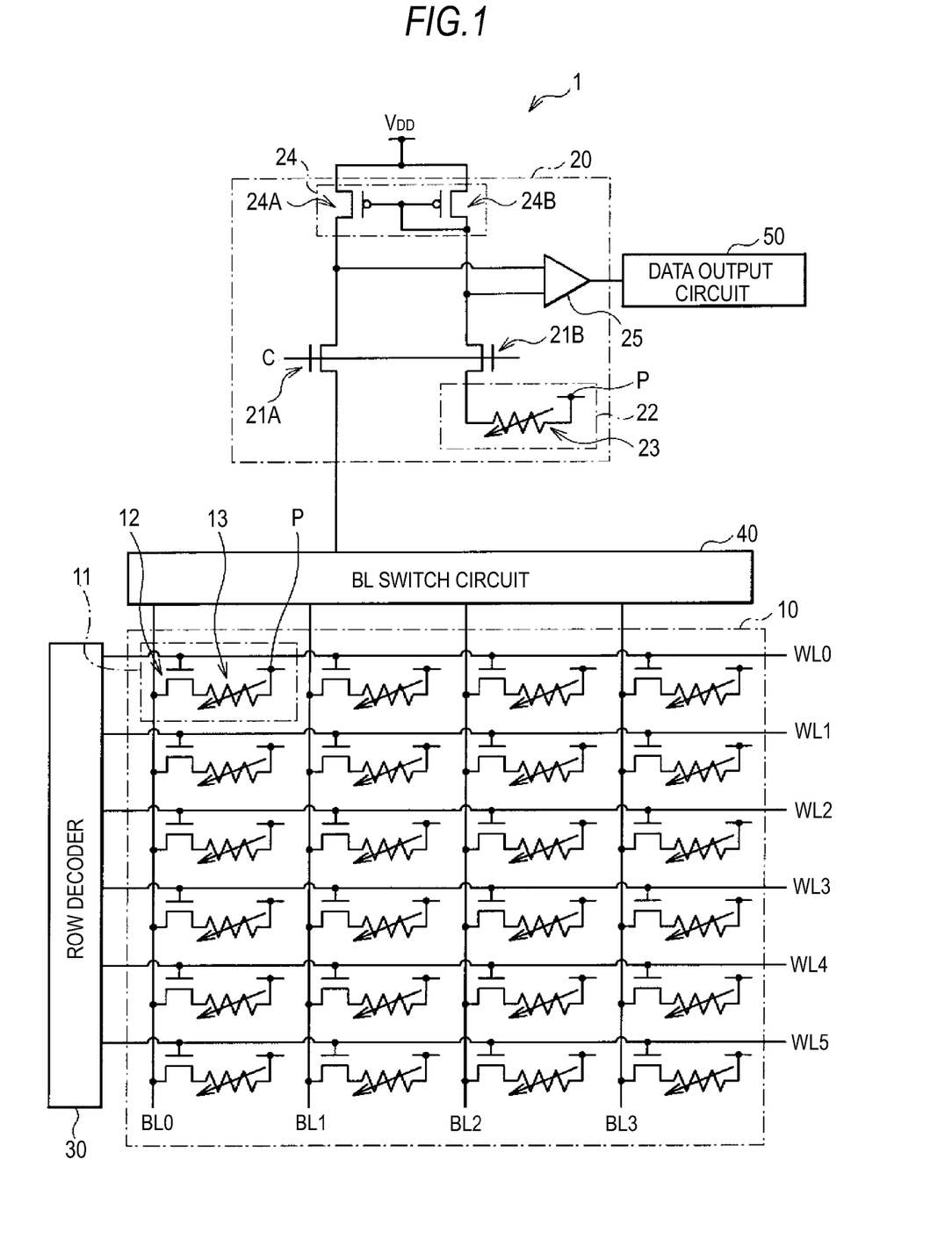
FIG. 1 is a diagram showing an example of the schematic configuration of a memory apparatus according to a first embodiment of the present disclosure.

FIG. 1 shows the schematic configuration of a memory apparatus 1 according to a first embodiment of the present disclosure. This memory apparatus 1 is provided with a memory array (storage portion) 10, a read-out circuit 20, a ROW decoder 30, a BL switch circuit 40, and a data output circuit 50.

(Memory Array 10)

The memory array 10 has a plurality of memory cells 11 arranged in matrix (for example, 4 columns×6 rows) in column and row directions. A memory cell 11 is configured so that, for example, a Metal Oxide Semiconductor (MOS)-type transistor 12 and a resistance change element 13 (first resistance change element) are connected in series. One set of terminals (for example, drain terminals) of the transistors 12 in the memory cells 11 in the same columns are connected to common bit lines BL0 to BL3 extending in the column direction, and gate terminals of the transistors 12 in the memory cells 11 in the same rows are connected to common word lines WL0 to WL5 extending in the row direction. The other terminals (for example, source terminals) of the transistors 12 are connected to one set of terminals (for example, lower electrodes) of the resistance change elements 13 each forming a pair with the transistor 12. The other terminals (for example, upper electrode) of the resistance change elements 13 are connected to common terminals P having the same potential in units of blocks.

The word lines WL0 to WL5 are connected to the ROW decoder 30, and a column selection signal which is obtained by decoding an address signal is input to the gate terminal of the transistor 12 through the word lines WL0 to WL5. The bit lines BL0 to BL3 are connected to the BL switch circuit 40, and the bit line which is connected to a read-out target memory cell 11 is selected in the BL switch circuit 40. That is, the read-out target memory cell 11 is connected to the read-out circuit 20 via the BL switch circuit 40.

Figure 2A:
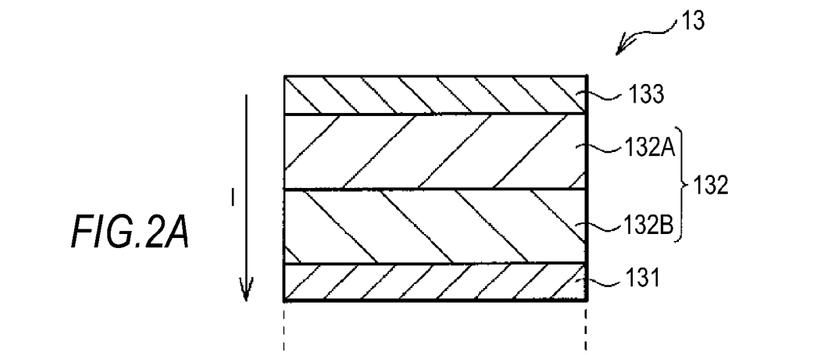
FIGS. 2A and 2B are diagrams showing the configuration of a first resistance change element in the memory cell shown in FIG. 1.
Figure 2B:
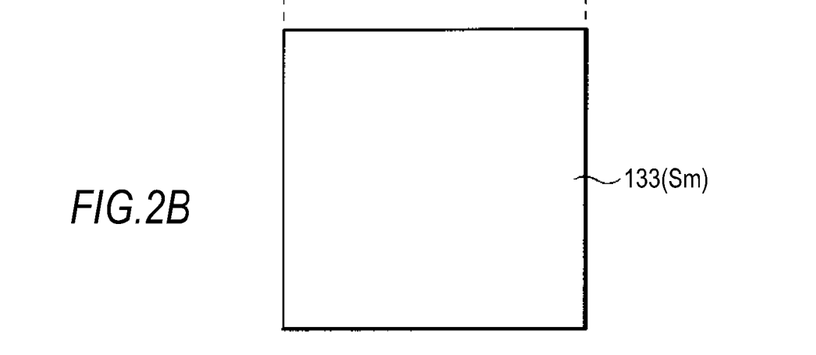

FIG. 2A shows the cross-section configuration of a resistance change element 13, and FIG. 2B shows the planar shape of the resistance change element 13. This resistance change element 13 is a substantially quadrangular prism-shaped element which has a lower electrode 131 (first electrode), a memory layer 132 and an upper electrode 133 (second electrode) in this order.

The lower electrode 131 which is provided on, for example, a silicon substrate (not shown) is a connecting portion with a transistor 12. This lower electrode 131 is made of a wiring material which is used in the semiconductor process, such as tungsten (W), tungsten nitride (WN), copper (Cu), aluminum (Al), molybdenum (Mo), tantalum (Ta) and silicide. When the lower electrode 131 is made of a material in which ion conduction may occur in an electric field of copper and the like, the surface of the lower electrode 131 made of copper and the like may be covered with a material in which ion conduction and thermal diffusion do not easily occur, such as tungsten, tungsten nitride, titanium nitride (TiN) and tantalum nitride (TaN). In addition, when an ion source layer 132A to be described later includes aluminum, a metal film including at least one of chromium (Cr), tungsten, cobalt (Co), silicon (Si), gold (Au), palladium (Pd), molybdenum, iridium (Ir) and titanium (Ti), which are not easily ionized in comparison to aluminum, an oxide film, or a nitride film thereof is preferably used.

The memory layer 132 is constituted of the ion source layer 132A and a resistance change layer 132B. The ion source layer 132A includes elements which are to be movable irons (cations and anions) to be diffused into the resistance change layer 132B. As elements which can be cationized, one or two or more of metallic elements such as aluminum, germanium (Ge) and zinc (Zn) are included. As an ion conductive material which is to be anions, at least one of elements in Group 16 (chalcogen elements), such as oxygen (O), tellurium (Te), sulfur (S) and selenium (Se) is included. The ion source layer 132A is disposed on the side of the upper electrode 133, and here, the ion source layer 132A is brought into contact with the upper electrode 133. The metallic element and the chalcogen element bond with each other and form a metal chalcogenide layer. This metal chalcogenide layer mainly has a noncrystalline structure and acts as an ion supply source.

The metallic elements which can be cationized are reduced on a cathode electrode (for example, lower electrode 131) in the writing operation, and form a conduction path (filament) which is in a metal state. Accordingly, chemically stable elements which can be present in a metal state in the ion source layer 132A including the above-described chalcogen element are preferably used. Examples of such metallic elements include transition metal elements in Groups 4A, 5A and 6A of the periodic table other than the above-described metallic elements, that is, titanium, zirconium (Zr), hafnium (Hf), vanadium (V), niobium (Nb), tantalum, chromium, molybdenum and tungsten. One or two or more of these elements can be used. In addition, silver (Ag), silicon and the like may be used as an additive element of the ion source layer 132A.

Specific examples of the material for such an ion source layer 132A include ZrTeAl, TiTeAl, CrTeAl, WTeAl and TaTeAl. Examples of the material may also include CuZrTeAl which is obtained by adding copper to ZrTeAl, CuZrTeAlGe which is obtained by further adding germanium, and CuZrTeAlSiGe which includes an additive element. Otherwise, ZrTeMg which uses magnesium in place of aluminum may be used. As a metallic element which is to be ionized, the same additive element can be used even when using other transition metal elements such as titanium and tantalum in place of zirconium. For example, TaTeAlGe can be used. In addition, as an ion conductive material, sulfur, selenium or iodine (I) may be used other than tellurium as described above. Specifically, ZrSAl, ZrSeAl, ZrIAl, CuGeTeAl and the like can be used. Aluminum may not be included and CuGeTeZr and the like may be used.

Other elements may be added to the ion source layer 132A in order to, for example, prevent film peeling in the high-temperature heating process in the memory layer 132. For example, silicon is an additive element which can be simultaneously expected to improve the holding characteristic, and it is preferably added with zirconium to the ion source layer 132A. However, when the amount of the added silicon is too small, the film peeling prevention effect is not expected, and when the amount is too large, the excellent memory operation characteristic is not obtained. Accordingly, the content of silicon in the ion source layer 132A is preferably in the range of about 10 to 45%.

The resistance change layer 132B is disposed on the side of the lower electrode 131, and here, the resistance change layer 132B is brought into contact with the lower electrode 131. This resistance change layer 132B functions as a barrier on the electric conduction. When a predetermined voltage is applied between the lower electrode 131 and the upper electrode 133, the resistance value of the resistance change layer 132B changes.

The resistance change layer 132B has a layer including, for example, a transition metal oxide. For example, the resistance change layer 132B includes an aluminum oxide ($AlO_x$) layer and a transition metal oxide layer having a lower resistance than an aluminum oxide. The transition metal oxide layer and the aluminum oxide layer are disposed in order from the lower electrode 131. In this manner, the resistance change layer 132B is constituted, and thus the repetition durability of the resistance change element 13 can be improved. The transition metal oxide layer is preferably a conductive oxide having an insulating property which is not high. Specifically, the transition metal oxide layer is preferably an oxide of at least one of a transition metal group including titanium, zirconium, hafnium, vanadium, niobium, tantalum, chromium, molybdenum and tungsten. In addition, the resistance change layer 132B may not include a transition metal oxide layer, but may include an aluminum oxide layer. The resistance change layer 132B may include a gallium oxide ($GaO_x$) which has been used.

The upper electrode 133 can use a known semiconductor wiring material as in the case of the lower electrode 131. However, the upper electrode is preferably made of a stable material which does not react with the ion source layer 132A even after post-annealing.

When compared to a storage element such as a flash memory, the above-described resistance change element 13 can simplify the configuration of the memory cell 11, whereby the size dependency on a storage element is reduced. Accordingly, a large signal can be obtained and a feature of a resistance to scaling is given. In addition, a time for writing can be shortened to about 5 nanoseconds, and the operation is possible with, for example, a low voltage of about 1 V and a low current of about 20 μA.

(Read-Out Circuit 20)

The read-out circuit 20 is provided between a power source $V_{DD}$ and the BL switch circuit 40, and is constituted of transistors 21A and 21B for application of a read-out voltage, a reference memory cell 22, a current mirror current source load 24 and a sense amplifier 25.

In this read-out circuit 20, when a predetermined voltage is applied to terminals C of the transistors 21A and 21B, the transistors 21A and 21B output a read-out voltage Vr suitable for a state of a selected read-out target memory cell 11. Here, the transistors 21A and 21B have the same transistor size so that the current supplying capabilities of the transistors 21A and 21B are the same under the condition where the same voltage is applied thereto.

Figure 3A:
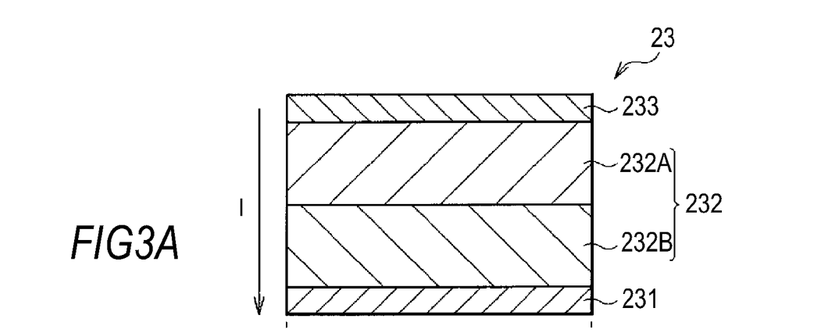
FIGS. 3A and 3B are diagrams showing the configuration of a second resistance change element in the reference memory cell shown in FIG. 1.
Figure 3B:
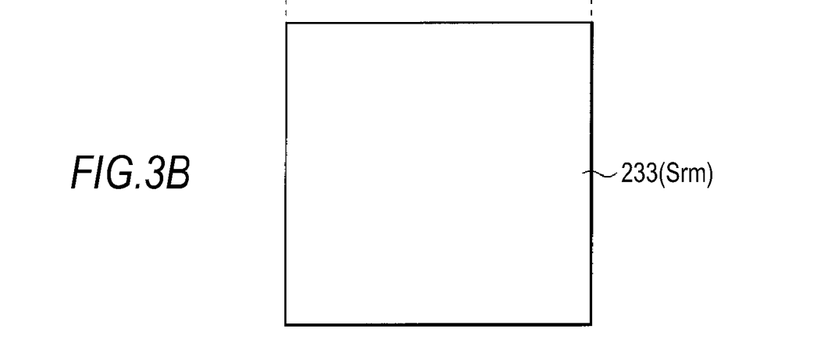

The reference memory cell 22 is provided with a resistance change element 23 (second resistance change element) shown in FIGS. 3A and 3B. FIG. 3A shows the cross-section configuration of the resistance change element 23, and FIG. 3B shows the planar configuration of the resistance change element 23. The resistance change element 23 is a substantially quadrangular prism-shaped element which has a lower electrode 231, a memory layer 232 including an ion source layer 232A and a resistance change layer 232B, and an upper electrode 233 in this order. For example, the lower electrode 231 is connected to the transistor 21B and the upper electrode 233 is connected to the above-described common terminal P.

In this embodiment, the lower electrode 231, the memory layer 232, and the upper electrode 233 of the resistance change element 23 constituting the read-out circuit 20 are made of the same constituent material as the resistance change element 13 in the memory cell 11. The above-described same constituent material may not be exactly the same material and may not have the same composition. This means that substantially the same electric characteristic (a change in the resistance value with respect to the applied voltage) is obtained when the resistance change elements 13 and 23 have the same size.

When the quadrangular areas of the upper surfaces (and lower surfaces) of the resistance change element 13 and the resistance change element 23 having a substantially quadrangular prism shape as shown in FIGS. 2B and 3B are represented by Sm and Srm, respectively, Srm is larger than Sm. That is, regarding the cross-section area when the cutting is performed in a direction perpendicular to a direction of the application of a voltage or a current (direction connecting the lower electrodes 131 and 233 and the upper electrodes 133 and 233), the resistance change element 23 is larger than the resistance change element 13. Accordingly, the electric resistance value of the resistance change element 23 is smaller than that in the high resistance state of the resistance change element 13 with respect to the application of the same level of voltages. When the resistance values of the resistance change elements 23 and 13 are the same, or when the resistance value of the resistance change element 23 is larger, the reference memory cell 22 does not function as a reference memory. In FIG. 1, the reference memory cell 22 has one resistance change element 23, but the reference memory cell 22 may have a plurality of resistance change elements 23. In addition, when the reference memory cell 22 is formed of a plurality of resistance change elements 23, all of the resistance values of the resistance change elements 23 with respect to the same level of applied voltages may be the same, or may be different from each other.

The resistance change element 23 in the reference memory cell 22 is preferably in an erased state (state corresponding to the erased state of the resistance change element 13 or a high resistance state to be described later), and more preferably in a state in which the writing has not been performed after the manufacturing of the memory apparatus (no writing voltage has been applied), that is, in an initial state. The reason for this is that when a large voltage is applied, the resistance value of the resistance change element 23 changes and thus there is concern that the resistance value of the resistance change element 23 may become smaller than that in the low resistance state of the resistance change element 13. In addition, in general, when compared to each of the memory cells 11, the reference memory cell 22 is accessed more frequently and deteriorates more easily. The deterioration is suppressed by using an initial-state element to which a large voltage for writing has not been applied.

In the current mirror current source load 24, a current Im flowing through a read-out target memory cell 11 and a current Irm flowing through the reference memory cell 22 are detected by a transistor 24A connected to the memory array 10 and a transistor 24B connected to the reference memory cell 22. A current difference between the current Im and the current Irm is converted into a voltage and then amplified by the sense amplifier 25, and thus the relationship in level between the current Im and the current Irm (that is, whether the memory cell 11 is in a written state or in an erased state) is determined and output to the data output circuit 50.

[Actions and Effects of Memory Apparatus 1]

In the memory apparatus 1 according to this embodiment, when a voltage pulse is applied from the power source $V_{DD}$, the electric characteristic of the memory layer 132, for example, the resistance value changes via the lower electrode 131 and the upper electrode 133 in the resistance change element 13, and thus information is stored (written, erased, read out). Hereinafter, the operation thereof will be described in detail.

1. Writing

First, a positive voltage is applied to the resistance change element 13 so that the upper electrode 133-side has, for example, a positive potential and the lower electrode 131-side has a negative potential. Accordingly, a current I flows in the direction of the arrow shown in FIGS. 2A and 2B in the resistance change element 13, and the metallic elements in the ion source layer 132A are diffused into the resistance change layer 132B and reduced on the side of the lower electrode 131. As a result, a conduction path (filament) is formed at the interface between the lower electrode 131 and the resistance change layer 132B. Otherwise, the ionized metallic elements are left in the resistance change layer 132B, and thus an impurity level is formed and a conduction path is formed in the resistance change layer 132B. Accordingly, the resistance value of the resistance change layer 132B is lowered. Thereafter, even when the voltage applied to the resistance change element 13 is eliminated by removing the positive voltage, the low resistance state is held, and thus the information is written. The arrows on the resistance change elements 13 and 23 shown in FIG. 1 correspond to the arrows of FIGS. 2A to 3B. That is, the writing is carried out in the resistance change element 13 when a current flows in a direction toward the BL from the terminal P.

2. Erasing

In the erasing process, a negative voltage is applied to the resistance change element 13 so that the upper electrode 133-side has, for example, a negative potential and the lower electrode 131-side has a positive potential. Accordingly, the metallic elements of the conduction path formed in the resistance change layer 132B are ionized again and dissolved in the ion source layer 132A, and the resistance value of the resistance change layer 132B increases again. Thus, the resistance change element 13 enters a high resistance state. In this manner, the erasing is performed.

Figure 4:
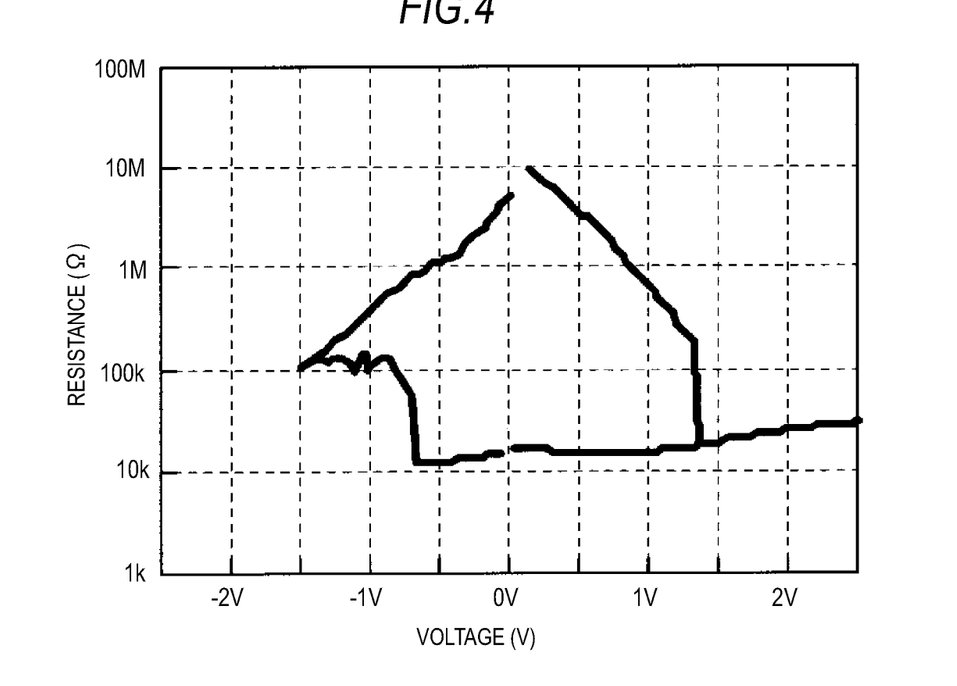
FIG. 4 is a resistance-voltage characteristic diagram of the memory cell shown in FIG. 1.

FIG. 4 shows a resistance-voltage characteristic of the memory cell 11 including the resistance change element 13. In FIG. 4, a gate voltage of the transistor 12 is typically in an ON-state. When the resistance change element 13 is in an initial state, the resistance value is high and close to 10 MΩ. However, when a positive voltage is applied, the resistance value is lowered, and when a voltage of +1.3 V or higher is applied, the resistance value is rapidly lowered up to about 10 kΩ (writing).

Next, when a voltage whose polarity is opposite to that in the case of the above-described writing is gradually increased and applied, the resistance value rapidly increases at −0.7 V. Finally, the resistance value increases up to the same degree as in the initial state (erasing). The low resistance state and the high resistance state are associated with data "1" and "0", respectively, and thus 1-bit data is stored. As is obvious from FIG. 4, the resistance value of the resistance change element 13 in an erased state (initial state) nonlinearly changes in accordance with the level of the applied voltage. The resistance change element 13 has such a characteristic, and thus it becomes difficult to prepare a reference memory cell for accurately determining the state of the resistance change element 13 in the read-out process.

3. Read-Out

In the read-out process, first, the ROW decoder 30 selects any one of the word lines WL0 to WL5 and the BL switch circuit 40 selects any one of the bit lines BL0 to BL3 to determine a read-out target memory cell 11. Next, the terminal P is set at 0 V, and a relatively small voltage (for example, 0.1 V to 1 V) which is insufficient for the writing and erasing is applied to the terminal C. The voltage may be applied in any direction. For example, the voltage which is applied to the terminal C is a read-out voltage Vr to which Vgs is added. When a voltage Vr is applied to a memory cell 11, which is selected as a read-out target by the transistors 21A and 21B for application of a read-out voltage, and the reference memory cell 22, a current Im and a current Irm flow to the memory cell 11 and the reference memory cell 22, respectively. The relationship in level between the current Im and the current Irm is compared by the current mirror current source load 24 and the sense amplifier 25, and the result thereof is output to the data output circuit 50. In other words, the resistance state of the memory cell 11 is compared to the resistance state of the reference memory cell 22 to determine accumulated data (written or erased state of the memory cell 11).

The above process is a general read-out process, but the characteristics of the read-out process in this embodiment will be described in detail with reference to a comparative example.

3-1. Comparative Example

Figure 5:
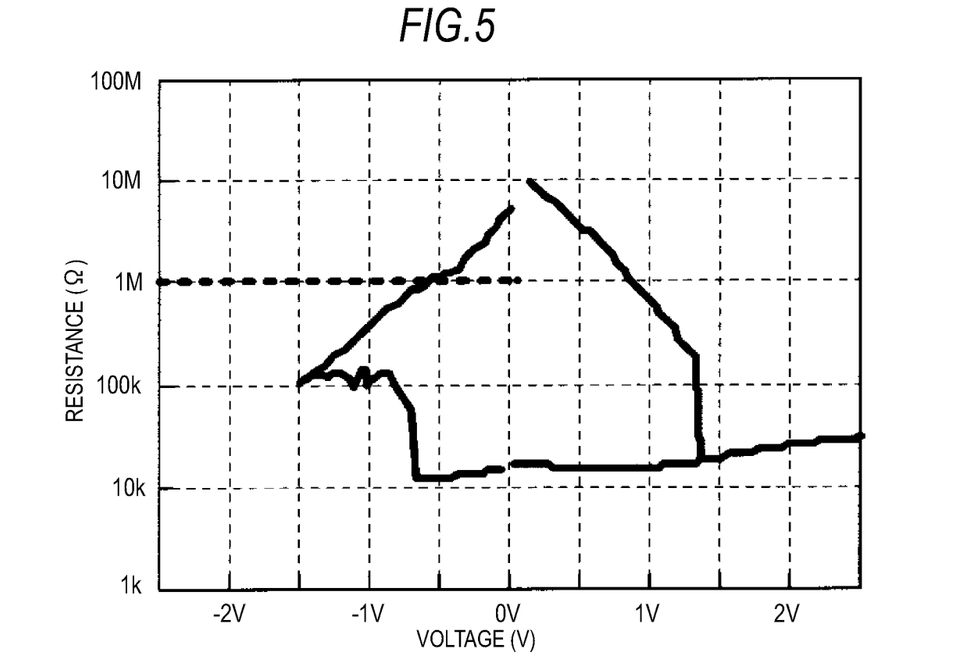
FIG. 5 is a resistance-voltage characteristic diagram of a reference memory cell according to a comparative example.

FIG. 5 shows, as a comparative example, a resistance-voltage characteristic of a reference memory cell when using a reference memory cell which has a resistance value of 1 MΩ in place of the reference memory cell 22 including the resistance change element 23. In FIG. 5, a resistance-voltage characteristic of the reference memory cell is shown by the broken line, and the resistance-voltage characteristic of the memory cell 11 shown by the solid line in FIG. 4 overlaps therewith.

For example, in the case in which a voltage of 0.3 V (−0.3 V) is applied in an erasing direction and the read-out is thus performed, when the resistance value of the memory cell 11 is larger than the resistance value 1 MΩ of the reference memory cell, data "0" is determined, and when the resistance value of the memory cell 11 is smaller than the resistance value 1 MΩ of the reference memory cell, data "1" is determined. However, the resistance value of the reference memory cell is constant in comparison to the nonlinear change in the resistance value of the memory cell 11 in accordance with the level of the read-out voltage, whereby there is concern that the state of the memory cell 11 may be incorrectly determined when the level of the read-out voltage is changed.

3-2. This Embodiment

In comparison to the above-described comparative example, the memory apparatus 1 according to this embodiment includes the resistance change element 23 in the reference memory cell 22, and the resistance change element 23 is made of the same constituent material as the resistance change element 13 in the memory cell 11. Therefore, the resistance change element 23 shows the same resistance change characteristic as the resistance change element 13. That is, the resistance value (reference resistance) of the reference memory cell 22 changes to correspond to the change in the resistance value of the memory cell 11 with respect to an applied voltage.

Figure 6:
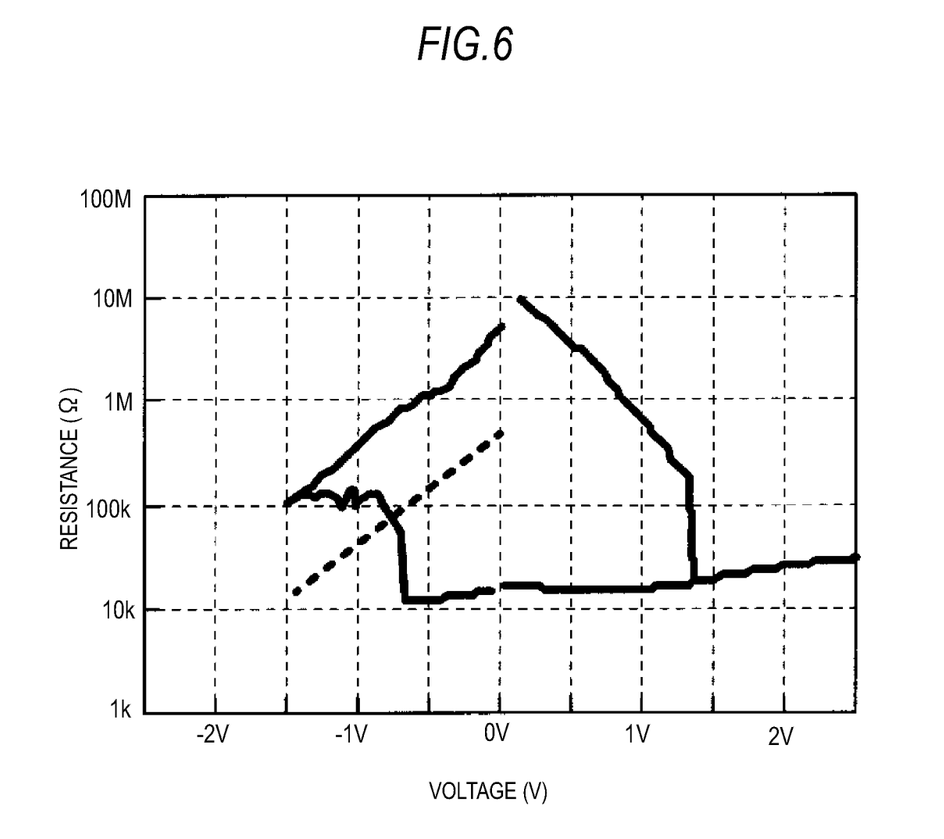
FIG. 6 is a resistance-voltage characteristic diagram of the memory cell and the reference memory cell shown in FIG. 1.

FIG. 6 shows a resistance-voltage characteristic of the reference memory cell 22 having the resistance change element 23. In FIG. 6, the resistance-voltage characteristic of the reference memory cell 22 is shown by the broken line, and the resistance-voltage characteristic of the memory cell 11 shown by the solid line in FIG. 4 overlaps therewith. In addition, a ratio (Sm:Srm) between an area Sm of the resistance change element 13 and an area Srm of the resistance change element 23 in FIG. 6 is 1:10. That is, the resistance value with respect to an applied voltage of the reference memory cell 22 in an initial state is 1/10 of the resistance value of the memory cell 11 in an initial state.

From FIG. 6, it can be confirmed that the resistance-voltage characteristic of the memory cell 11 is the same as the resistance-voltage characteristic of the reference memory cell 22, and the resistance value (reference resistance) of the reference memory cell 22 changes to correspond to the resistance value of the memory cell 11 which nonlinearly changes in accordance with the level of the voltage. The read-out has been described in terms of the voltage application in an erasing direction, but also in the case of the voltage application in a writing direction, the read-out is performed in the same manner.

As described above, in the memory apparatus 1 according to this embodiment, the reference memory cell 22 is constituted of the resistance change element 23 which shows the same resistance change characteristic as the resistance change element 13 included in the memory cell 11. Therefore, the resistance value of the resistance change element 23 (reference memory cell 22) changes to be substantially proportional to the resistance value of the resistance change element 13 (memory cell 11). Accordingly, the state of the memory cell 11, that is, the written state or the erased state can be accurately determined regardless of the level of the read-out voltage. That is, the read-out voltage can be freely set.

In addition, since the resistance change elements 13 and 23 are made of the same constituent material and only the sizes of the areas of the resistance change elements 13 and 23 may be changed, the resistance change element 23 can be easily manufactured by sputtering.

Furthermore, by using the resistance change element 23 in an initial state, the deterioration of the resistance change element 23 is suppressed and the state of the memory cell 11 can be determined with higher accuracy.

In this embodiment, since the electric resistance of the resistance change element 23 is set to be smaller than that of the resistance change element 13, the area Srm of the resistance change element 23 is set to be larger than the area Sm of the resistance change element 13. However, the areas may be set to be the same as each other and the layer thickness of the memory layer 232 may be set to be smaller than the layer thickness of the memory layer 132 to reduce the electric resistance.

Hereinafter, other embodiments of the present disclosure will be described. In the following description, the same constituent parts as in the above-described embodiment will be denoted by the same reference numbers and descriptions thereof will be appropriately omitted.

Second Embodiment

Figure 7:
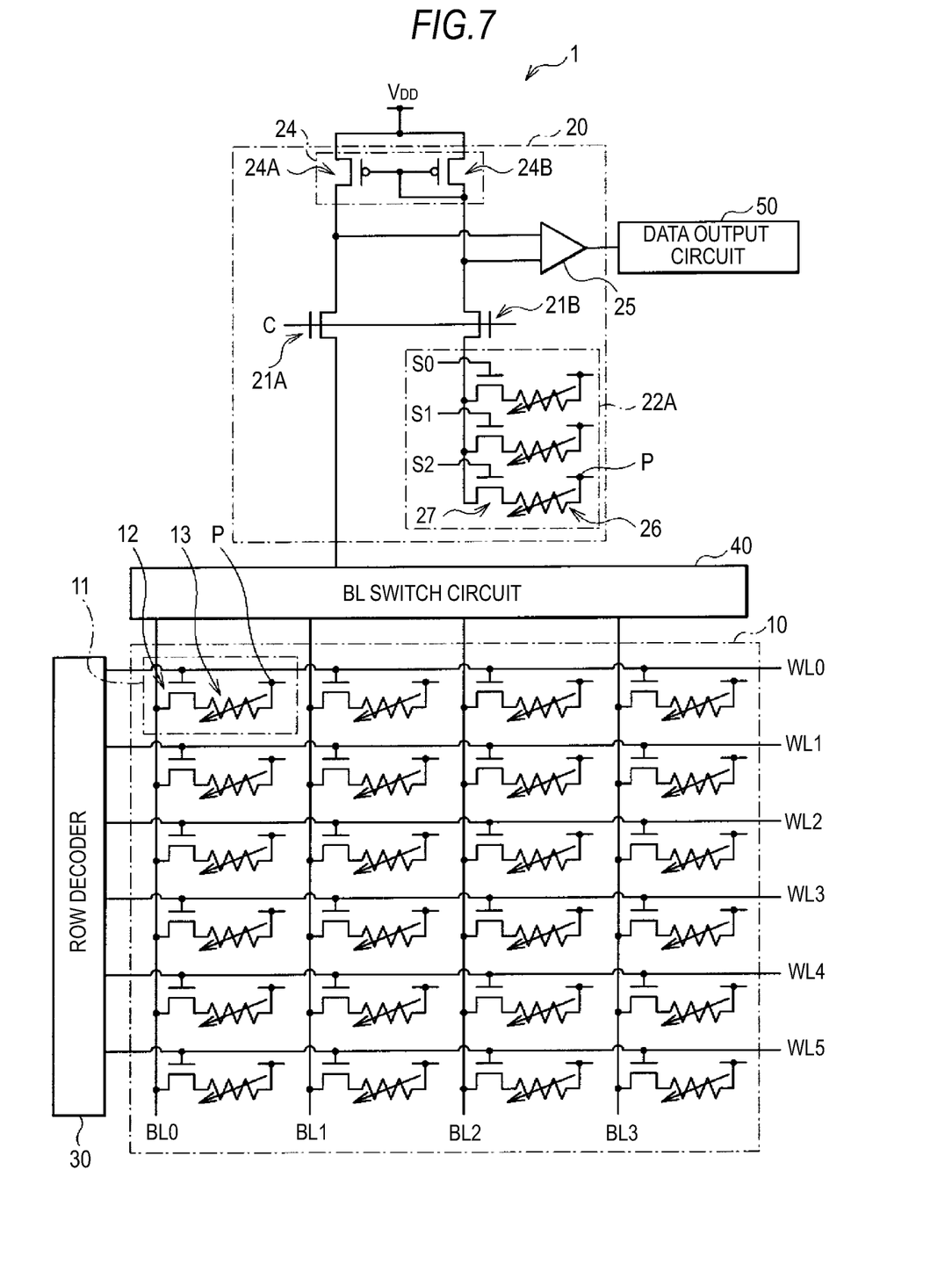
FIG. 7 is a diagram showing an example of the schematic configuration of a memory apparatus according to a second embodiment of the present disclosure.

FIG. 7 shows the schematic configuration of a memory apparatus 2 according to a second embodiment of the present disclosure. This embodiment is different from the above-described first embodiment in that in a reference memory cell 22A, a plurality of resistance change elements 26 having the same configuration as that of the resistance change element 13 in the memory cell 11 are included as a second resistance change element. Each of the plurality of resistance change elements 26 is connected in parallel to one terminal of a transistor 21B for application of a read-out voltage via a transistor 27. In FIG. 7, three resistance change elements 26 are connected in parallel, but the number of the resistance change elements 26 may be two or four or more.

Figure 8A:
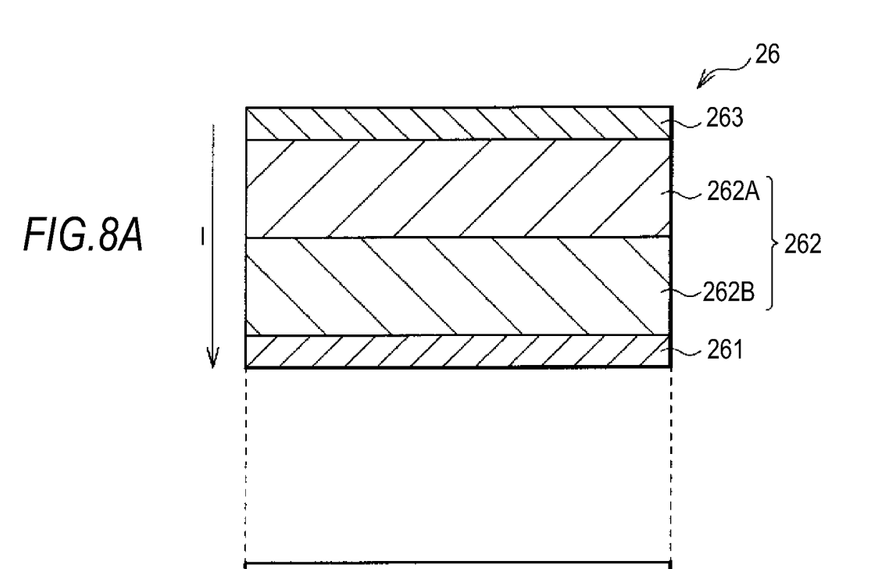
FIGS. 8A and 8B are diagrams showing the configuration of the resistance change element in the reference memory cell shown in FIG. 7.
Figure 8B:
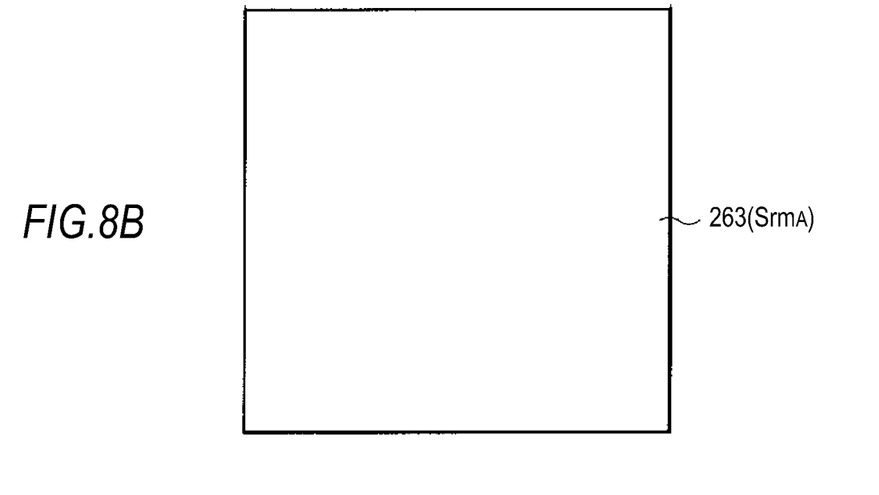

FIG. 8A shows the cross-section configuration of the resistance change element 26 and FIG. 8B shows the planar configuration of the resistance change element 26. The resistance change element 26 is a substantially quadrangular prism-shaped element which has a lower electrode 261, a memory layer 262 including an ion source layer 262A and a resistance change layer 262B and an upper electrode 263 in this order. For example, the lower electrode 261 of the resistance change element 26 is connected to the transistor 27, and the upper electrode 263 is connected to the above-described common terminal P. That is, in this embodiment, selection terminals S0 to S2 are individually ON/OFF controlled to adjust the number of the resistance change elements 26 which are connected to the transistor 21B, and thus the resistance value of the second resistance change element (the plurality of resistance change elements 26) is set to be smaller than the resistance value in a high resistance state of the first resistance change element (resistance change element 13) with respect to the same level of applied voltages.

The lower electrode 261, the memory layer 262, and the upper electrode 263 of the resistance change element 26 are made of the same constituent material as the resistance change element 13 in the memory cell 11, and an area $Srm_A$ is the same as the area Sm. That is, the resistance change element 26 has the same configuration as that of the resistance change element 23. The resistance change elements 26 and 23 preferably have the same shape for easy manufacturing. However, when the area $Srm_A$ is the same as the area Sm, the shapes may be different from each other.

Figure 9:
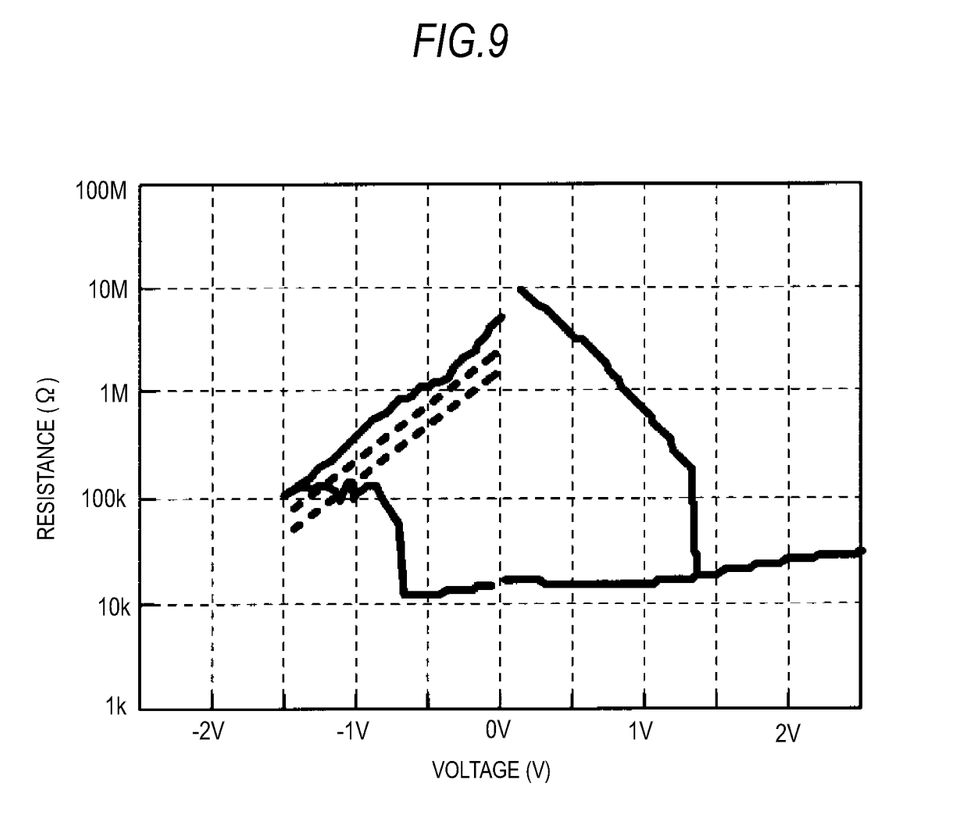
FIG. 9 is a resistance-voltage characteristic diagram of the memory cell and the reference memory cell shown in FIG. 7.

FIG. 9 shows a resistance-voltage characteristic of the reference memory cell 22A having the resistance change elements 26. In FIG. 9, a resistance-voltage characteristic of the reference memory cell 22A is shown by the broken line, and the resistance-voltage characteristic of the memory cell 11 shown by the solid line in FIG. 4 overlaps therewith. When two of the terminals S0 to S2 are controlled to be in an ON-state, the resistance value of the reference memory cell 22A in an initial state is 2/3 of the resistance value of the memory cell 11 in an initial state, and when three of the terminals S0 to S2 are controlled to be in an ON-state, the resistance value of the reference memory cell 22A in an initial state is 1/3 of the resistance value of the memory cell 11 in an initial state. When the resistance value of the memory cell 11 is the same as the resistance value of the reference memory cell 22A, the reference memory cell 22A does not function as a reference memory cell. Accordingly, in this embodiment, two or more of the plurality of resistance change elements 26 connected in parallel may be selected.

In the memory apparatus 2 according to this embodiment, the reference memory cell 22A is constituted of the plurality of resistance change elements 26 having the same configuration as that of the resistance change element 13 in the memory cell 11. Therefore, in addition to the effects of the above-described embodiment, the manufacturing process can be simplified and the reference resistance level can be easily adjusted.

As described above, the present disclosure has been described with reference to the embodiments, but the present disclosure is not limited to the above-described embodiments, and various modifications can be made. For example, the materials for the respective layers described in the above-described embodiments are not limited, other materials may be used. In addition, in the above-described embodiments, the description has been provided in which the constituent materials for the resistance change elements 23 and 26 are the same as that of the resistance change element 13 of the memory cell 11. However, the constituent materials may be different if the resistance-voltage characteristic of the reference memory cell shows substantially the same change (tendency) as that of the memory cell.

In addition, for example, in the above-described embodiments, the resistance change elements 13, 23 and 26 having a substantially square planar shape have been described. However, the planar shape may be rectangular or other polygonal, or annular, and the three-dimensional shape is not limited to a columnar shape and may be other shapes.

In the above-described embodiments, the method of performing the read-out of the selected memory cell 11 by a so-called voltage application current sensing method has been described. However, the read-out may be performed by other read-out methods such as a voltage sensing method and a current sensing method.

The present disclosure contains subject matter related to that disclosed in Japanese Priority Patent Application JP 2010-276748 filed in the Japan Patent Office on Dec. 13, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory apparatus comprising:
a plurality of memory cells, each of the plurality of memory cells including a first resistance change element; and
a read-out circuit including a reference memory cell, the read-out circuit configured to compare a resistance state of a memory cell selected from among the plurality of memory cells to a resistance state of the reference memory cell to perform a read-out of the selected memory cell,
wherein,
the reference memory cell includes a second resistance change element,
a resistance value of the second resistance change element with respect to an applied voltage in a high resistance state is smaller than a resistance value of the first resistance change element with respect to the applied voltage in the high resistance state,
the second resistance change element and the first resistance change element have substantially same resistance change characteristics, and
the second resistance change element in the reference cell is formed of a plurality of resistance change elements connected to each other in parallel, and two or more of the plurality of resistance change elements are selected in a read-out operation.

2. The memory apparatus according to claim 1, wherein:
the first resistance change element has a first electrode, a second electrode, and a memory layer between the first and second electrodes, and
a resistance value of the memory layer changes due to an application of a voltage between the first and second electrodes.

3. The memory apparatus according to claim 1, wherein each of the plurality of resistance change elements in the second resistance change element is made of a material of which the first resistance change element is made.

4. The memory apparatus according to claim 1, wherein the first resistance change element and each of the plurality of resistance change elements in the second resistance change element have a same configuration.

5. The memory apparatus according to claim 1, wherein the second resistance change element is in an erased state.

6. The memory apparatus according to claim 1, wherein the second resistance change element is in an initial state.

7. The memory apparatus according to claim 2, wherein the first resistance change element has (i) an ion source layer that is on a side of the second electrode, the ion source layer including at least one of oxygen (O), tellurium (Te), sulfur (S) and selenium (Se) and at least one metallic element of copper (Cu), aluminum (Al), germanium (Ge) and zinc (Zn), and (ii) a resistance change layer that is on a side of the first electrode.

8. The memory apparatus according to claim 7, wherein the resistance change layer includes at least a transition metal oxide.

* * * * *